US 12,274,013 B2

(12) United States Patent
Huang et al.

(10) Patent No.: US 12,274,013 B2
(45) Date of Patent: Apr. 8, 2025

(54) ELECTRONIC DEVICE

(71) Applicant: Innolux Corporation, Miaoli County (TW)

(72) Inventors: Yung-Shen Huang, Miaoli County (TW); Chien-Wi Chen, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 203 days.

(21) Appl. No.: 18/082,588

(22) Filed: Dec. 16, 2022

(65) Prior Publication Data

US 2023/0232554 A1  Jul. 20, 2023

(30) Foreign Application Priority Data

Jan. 18, 2022  (CN) .......................... 202220126981.4

(51) Int. Cl.
*H05K 5/02* (2006.01)
(52) U.S. Cl.
CPC .................. *H05K 5/0217* (2013.01)
(58) Field of Classification Search
CPC ............... H05K 5/0217; G02F 1/1335; G02F 1/133507; G02F 1/133308; G02F 1/133509; G02F 1/133512; G02F 1/1333
See application file for complete search history.

(56) References Cited

U.S. PATENT DOCUMENTS

| | | | |
|---|---|---|---|
| 2012/0162880 A1* | 6/2012 | Yoon | H04N 5/64 361/679.01 |
| 2012/0182493 A1* | 7/2012 | Hwang | G02F 1/133308 349/58 |
| 2014/0146513 A1* | 5/2014 | Choi | G02F 1/133308 156/196 |
| 2014/0152940 A1* | 6/2014 | Wang | G02B 6/0011 349/62 |
| 2016/0095205 A1* | 3/2016 | Cho | G02F 1/133308 361/749 |
| 2017/0344053 A1* | 11/2017 | Kim | G02F 1/0102 |
| 2018/0144675 A1* | 5/2018 | Lee | G09G 3/2092 |
| 2023/0031141 A1* | 2/2023 | Shamsi | H04N 7/183 |

FOREIGN PATENT DOCUMENTS

TW  201416759  5/2014

* cited by examiner

*Primary Examiner* — Sagar Shrestha
*Assistant Examiner* — Peter Krim
(74) *Attorney, Agent, or Firm* — JCIPRNET

(57) ABSTRACT

An electronic device, including a display panel, a backboard, and an elastic member, is provided. The backboard includes a bottom portion, a side portion, and a carrier portion. The display panel is disposed on the carrier portion, and an accommodating space is provided between the carrier portion and the bottom portion. The elastic member includes a main body portion and a protruding portion disposed on the main body portion. The main body portion is located in the accommodating space between the bottom portion and the carrier portion, and the protruding portion is located between the side portion and the display panel. By disposing the main body portion in the accommodating space, light leakage from the assembly gap is reduced. By providing the protruding portion between the side portion and the display panel, breakage of the display panel by directly hitting the side portion is avoided.

19 Claims, 8 Drawing Sheets

ELECTRONIC DEVICE

CROSS-REFERENCE TO RELATED APPLICATION

This application claims the priority benefit of China application serial no. 202220126981.4, filed on Jan. 18, 2022. The entirety of the above-mentioned patent application is hereby incorporated by reference herein and made a part of this specification.

BACKGROUND

Technical Field

The disclosure relates to an electronic device, and more particularly to an electronic device with a better structural reliability.

Description of Related Art

Nowadays, the requirement for the appearance of electronic devices is based on the demand for streamlining and/or narrow frames, or cost down requirement. When the electronic device is a display, the backboard may be used as a housing, and the panel may be disposed on the backboard. The above-mentioned display lacks appearance such as front frame and plastic component such as carrier panel, so the cost is reduced. However, due to the lack of the front frame or the plastic component, light leakage is likely to occur at the corners of the front of the display. In addition, as the panel is disposed on the backboard, when the backboard is deformed, the panel is easily squeezed by the deformed backboard, resulting in breakage.

SUMMARY

The disclosure provides an electronic device with a better structural reliability.

The electronic device of the disclosure includes a display panel, a backboard, and an elastic member. The backboard includes a bottom portion, a side portion, and a carrier portion. The display panel is disposed on the carrier portion, and an accommodating space is provided between the carrier portion and the bottom portion. The elastic member includes a main body portion and a protruding portion disposed on the main body portion. The main body portion is located in the accommodating space between the bottom portion and the carrier portion of the backboard, and the protruding portion is located between the side portion of the backboard and the display panel.

Based on the above, in the embodiment of the disclosure, the main body portion of the elastic member is disposed in the accommodating space between the carrier portion and the bottom portion of the backboard. The main body portion is located between the bottom portion and the carrier portion of the backboard. The protruding portion is located between the side portion of the backboard and the display panel. Therefore, light leakage from the assembly gap is reduced. Breakage of the display panel by directly hitting the side portion of the backboard is avoided. That is, the issues of light leakage and the breakage of the display panel are handled simultaneously, which may enhance the structural reliability of the electronic device of the disclosure or reduce the cost effectively.

In order to make the aforementioned features and advantages of the disclosure comprehensible, embodiments accompanied with drawings are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

BRIEF DESCRIPTION OF THE DRAWINGS

Figure 1:
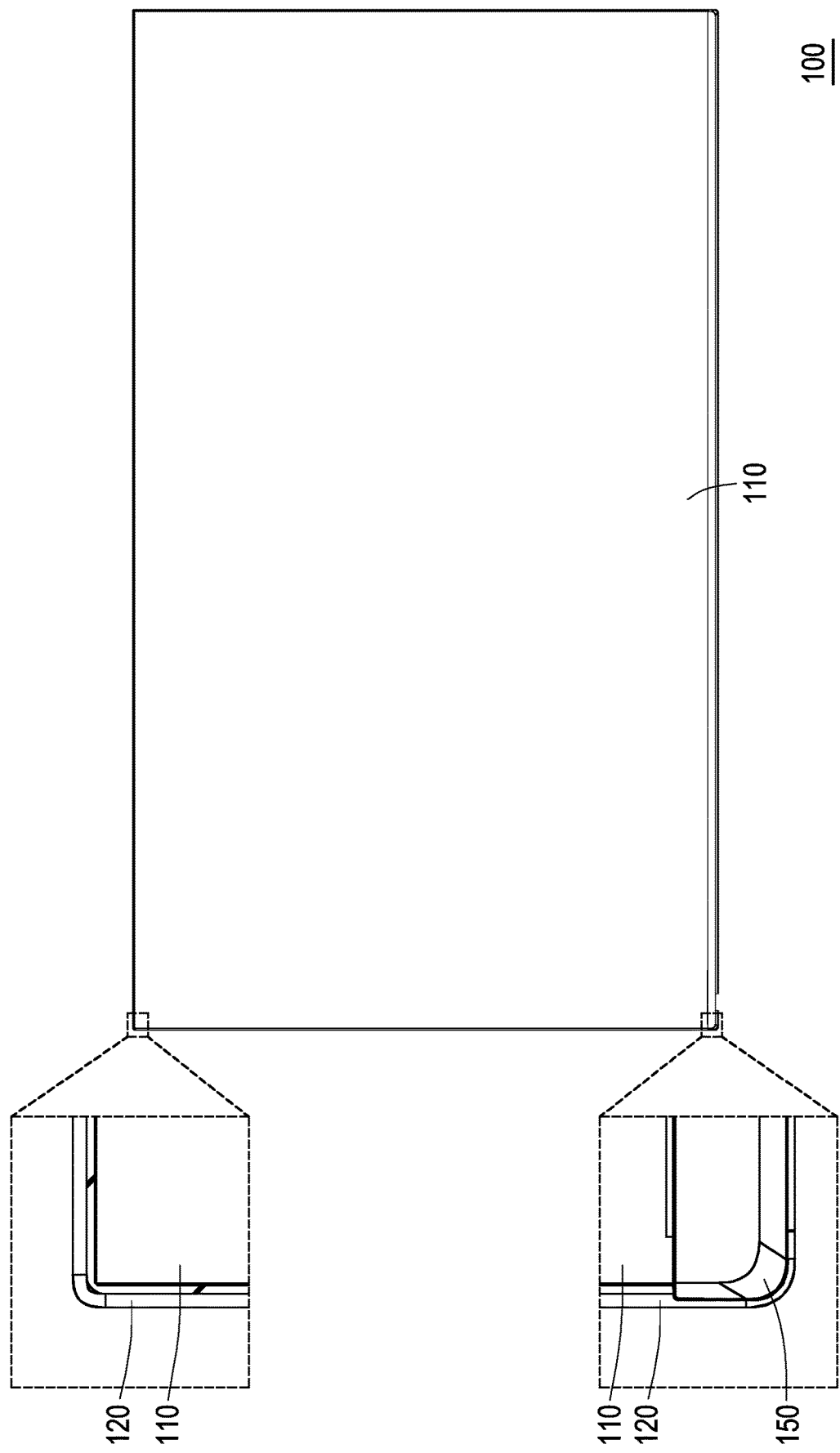
FIG. 1 is a schematic top view of an electronic device according to an embodiment of the disclosure.

This disclosure may be understood by referring to the following detailed description in conjunction with the accompanying drawings. It should be noted that, in order to facilitate understanding and for the concision of the drawings, only a part of the electronic device is shown in the drawings in this disclosure, and the specific elements in the drawings are not drawn according to actual scale. In addition, the number and size of each element in the figure are only exemplary and are not used to limit the scope of the disclosure.

In the description of the disclosure and the appended claims, certain terms will be used to refer to specific elements. Persons skilled in the art would understand that electronic device manufacturers may refer to the same elements under different names. This disclosure does not intend to distinguish between elements that have the same functions but different names.

In the following description and claims, the words "having" and "including" are open-ended words and thus should be interpreted as meaning "including but not limited to."

In addition, relative terms, such as "below" or "bottom" and "above" or "top," may be used in the embodiments to describe the relative relationship of one element to another element of the drawings. It will be understandable that if the device in the drawings is turned upside down, elements described on the "lower" side will become elements described on the "upper" side.

In some embodiments of the disclosure, regarding the words such as "connect", "interconnected", etc. referring to bonding and connection, unless specifically defined, these words mean that two structures are in direct contact or two structures are not in direct (indirect) contact, and other structures are provided to be disposed between the two structures. The word for joining and connecting may also include the case where both structures are movable or both structures are fixed. Furthermore, the term "coupling"

includes transfer of energy between two structures by means of direct or indirect electrical connection, or transfer of energy between two separate structures by means of mutual induction.

It should be understood that when an element or film layer is referred to as being "on", or "connected to" another element or film layer, the element or film layer may be directly on or connected to the another element or film layer, or intervening elements or film layers may also be present in between (non-direct circumstances). In contrast, when an element is referred to as being "directly on" or "directly connected to" another element or film layer, no intervening elements or film layers are present in between.

The term "about", "equal to", "equivalent" or "same", "substantially", or "essentially" is typically interpreted so that a value is within 20% of a given value or range, or within 10%, 5%, 3%, 2%, 1%, or 0.5% of a given value or range.

As used herein, the term(s) "film" and/or "layer" may refer to any continuous or discontinuous structure and material (e.g., materials deposited by the methods disclosed herein). For example, films and/or layers may include two-dimensional materials, three-dimensional materials, nanoparticles, or even partial or complete molecular layers, or partial or complete atomic layers, or atomic and/or molecular clusters. The films or layers may include materials or layers having pinholes and may be at least partially continuous.

Although the terms first, second, third, and so on may be used to describe diverse constituent elements, such constituent elements are not limited by the terms. The terms are only used to distinguish one single element from other element in the specification. The same terms may not be used in the claims, and may be replaced with "first," "second," "third" and the like in the order in which the elements in the claims are declared. Accordingly, a first element in the following description may be a second element in the claims.

Unless otherwise defined, all terms (including technical and scientific terms) used herein have the same meaning as commonly understood by one of ordinary skill in the art. It is understandable that these terms, such as those defined in commonly used dictionaries, should be interpreted to have a meaning consistent with the background or context of the related art and the disclosure, and not interpreted in an idealized or overly formal manner, unless specifically defined herein.

It should be understood that the following embodiments may replace, reorganize, and mix the technical features in several different embodiments to complete other embodiments without departing from the spirit of the disclosure.

The electronic device of the disclosure may include a display device, an antenna device, a sensing device, a light-emitting device, or a splicing device, but not limited thereto. The electronic device may include a bendable or flexible electronic device. The electronic device may include an electronic element. The electronic device may include, for example, liquid crystal or a light emitting diode (LED). The electronic element may include a passive element, an active element, or a combination thereof, for example, a capacitor, a resistor, an inductor, a variable capacitor, a filter, a diode, a transistor, a sensor, MEMS, a liquid crystal chip, etc., but not limited thereto. The diode may include a light-emitting diode (LED) or a non-light-emitting diode. The light emitting diode may include, for example, an organic light emitting diode (OLED), a mini LED, a micro LED, a quantum dot LED, fluorescence, phosphor, other suitable materials, or a combination of the above, but not limited thereto. The sensor may include, for example, a capacitive sensor, an optical sensor, an electromagnetic sensor, a fingerprint sensor (FPS), a touch sensor, an antenna, or a pen sensor, etc., but not limited thereto. Hereinafter, the display device will be used as an electronic device to illustrate the content of the disclosure, but the disclosure is not limited thereto.

Reference will now be made in detail to the exemplary embodiments of the disclosure, and examples of the exemplary embodiments are illustrated in the accompanying drawings. Whenever possible, the same reference symbols are used in the drawings and descriptions to indicate the same or similar parts.

Figure 2:
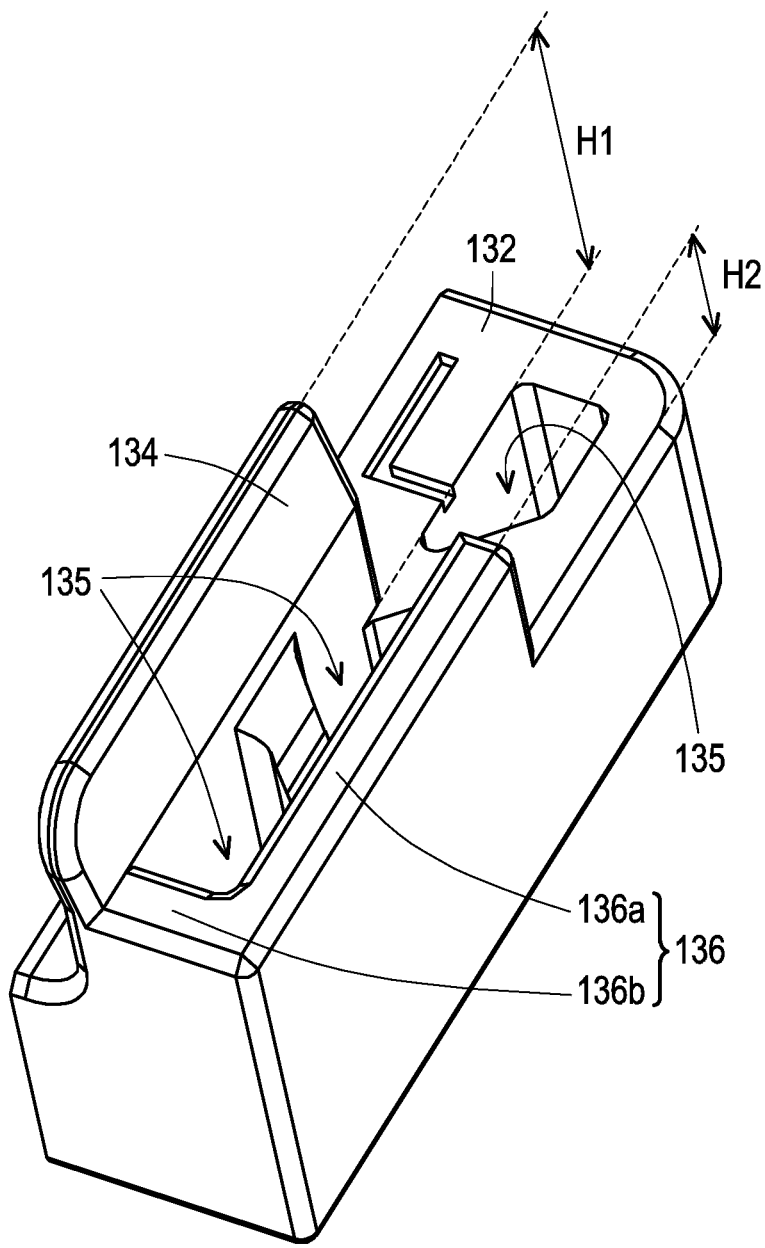
FIG. 2 is a perspective schematic view of the elastic member in the electronic device of FIG. 1.
Figure 3A:
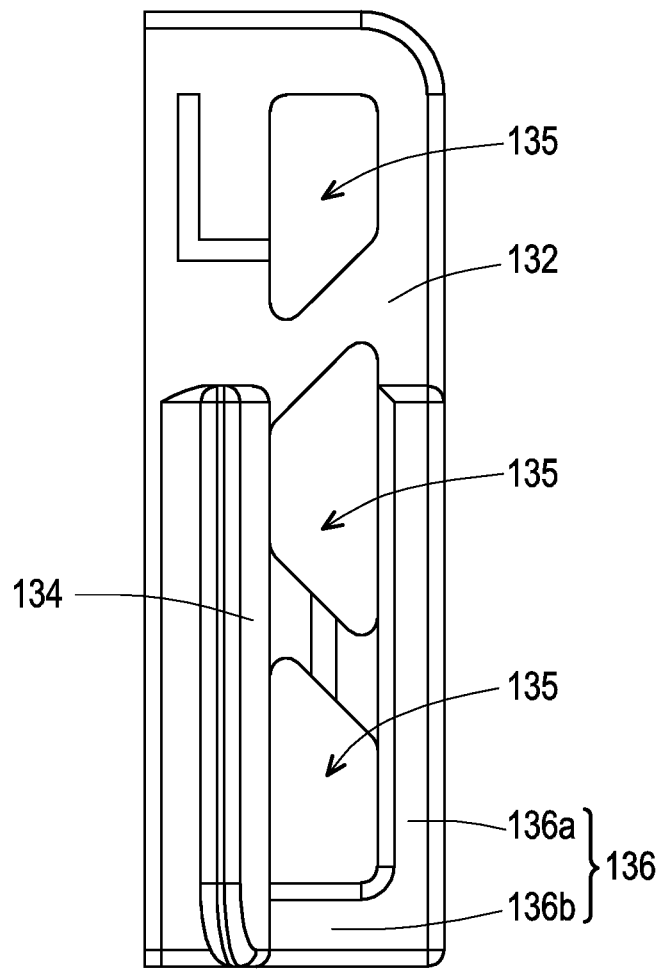
FIG. 3A is a front view of the elastic member of FIG. 2.
Figure 3B:
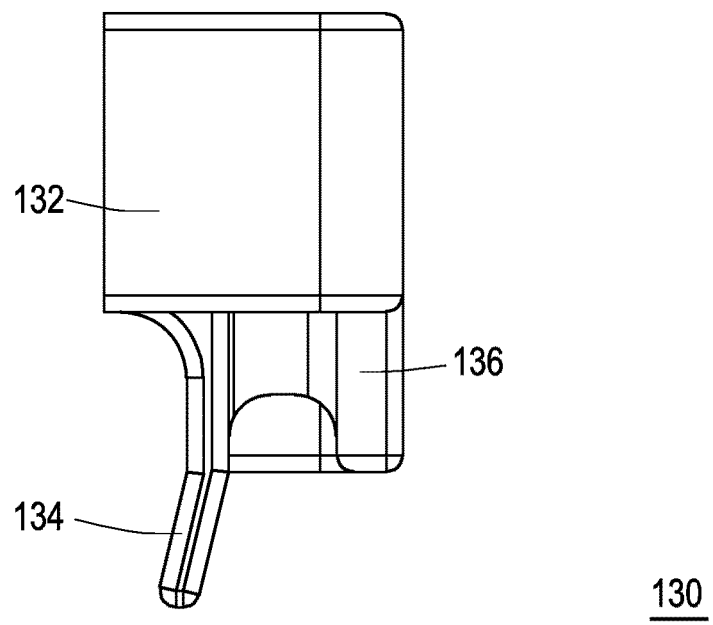
FIG. 3B is a top view of the elastic member of FIG. 2.
Figure 3C:
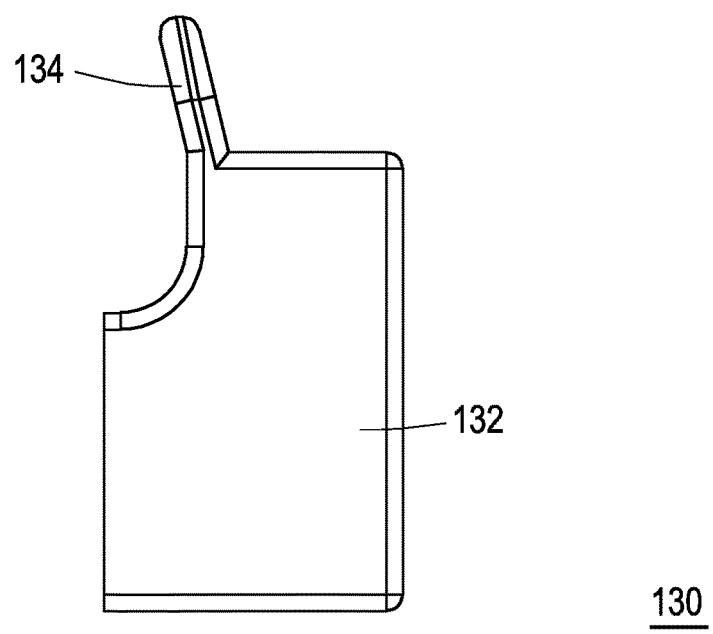
FIG. 3C is a bottom view of the elastic member of FIG. 2.
Figure 3D:
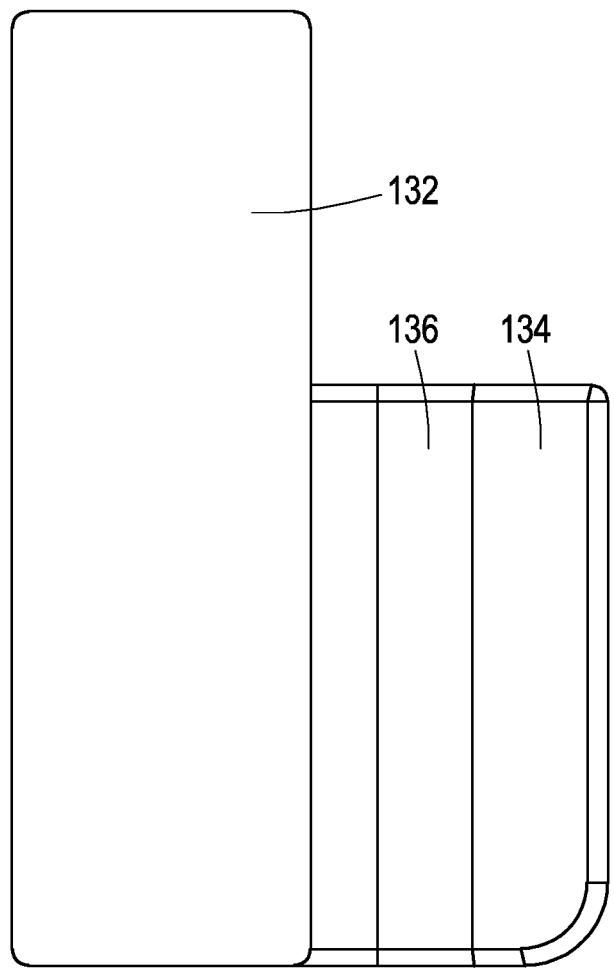
FIG. 3D is a left side view of the elastic member of FIG. 2.
Figure 3E:
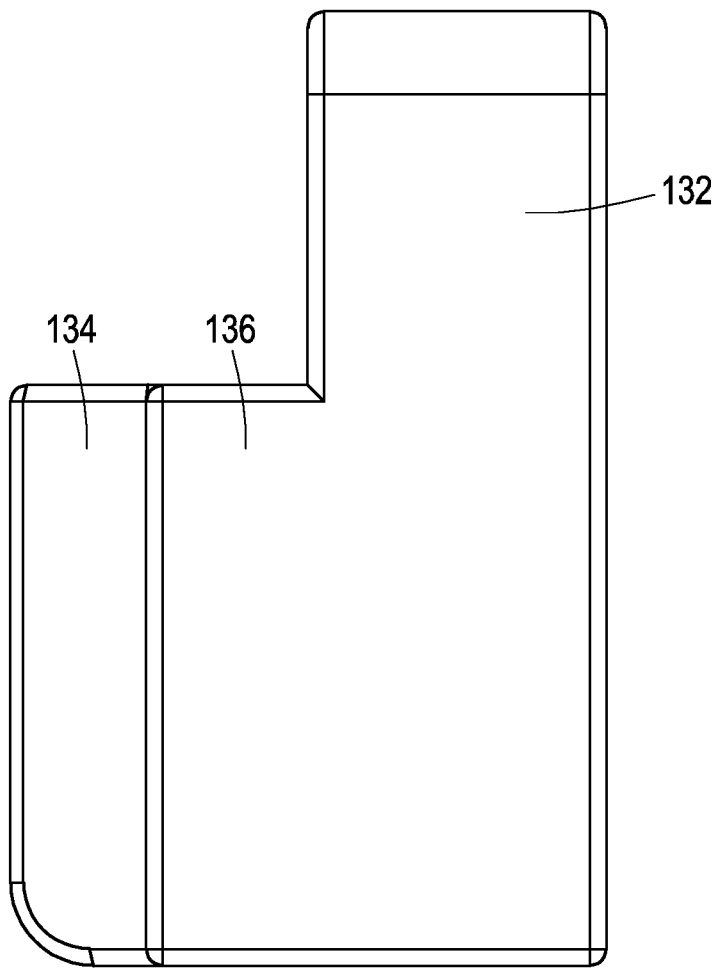
FIG. 3E is a right side view of the elastic member of FIG. 2.
Figure 4:
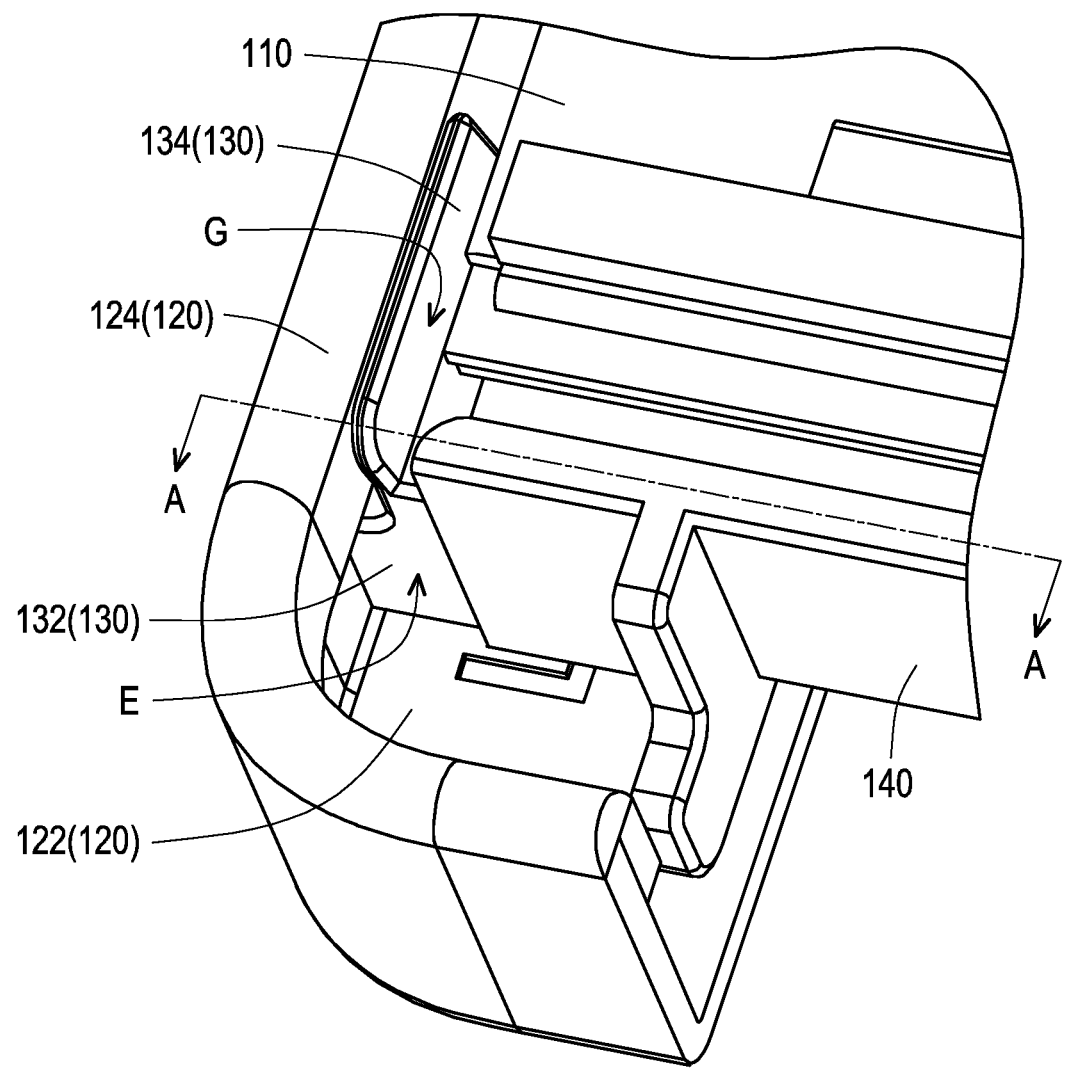
FIG. 4 is a perspective schematic view of the inner portion the electronic device of FIG. 1.
Figure 5:
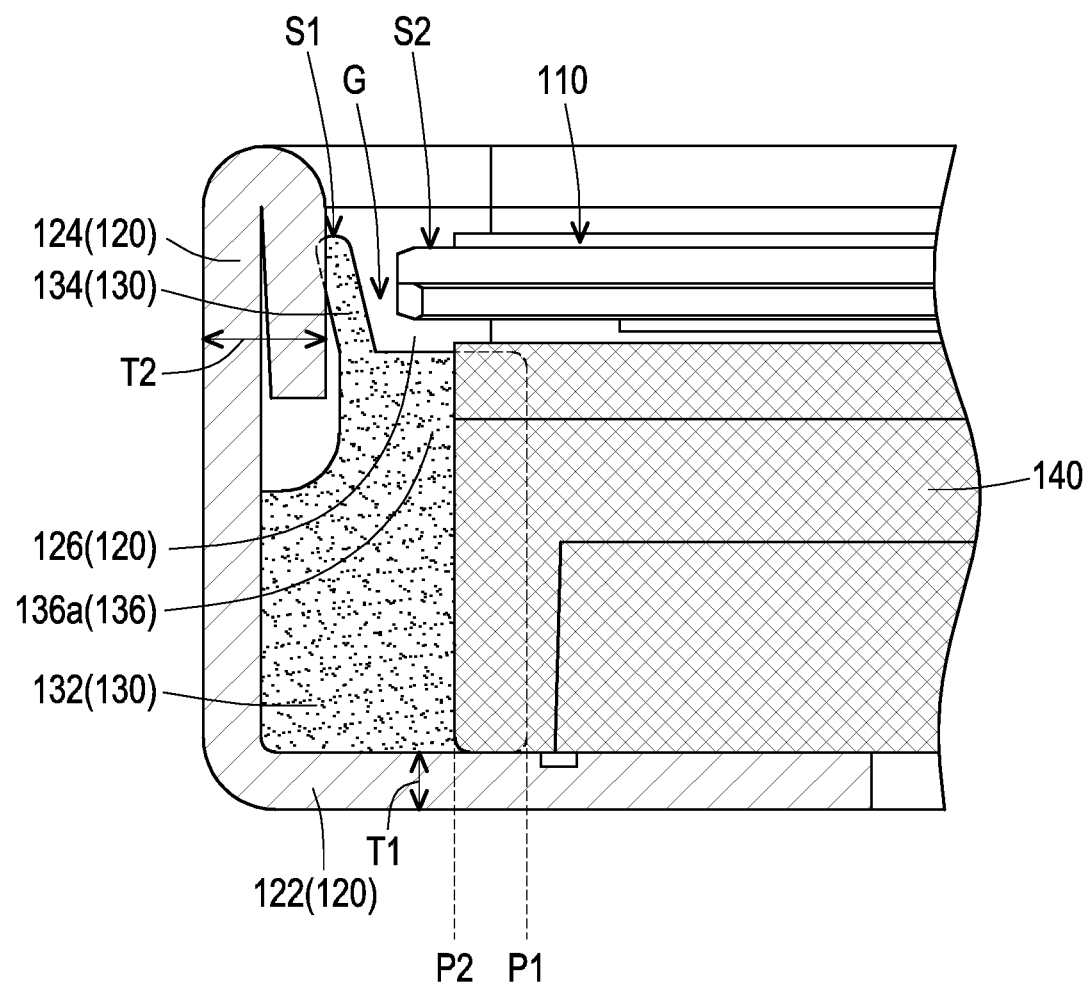
FIG. 5 is a cross-sectional schematic view along the section line A-A of FIG. 4.

FIG. 1 is a schematic top view of an electronic device according to an embodiment of the disclosure. FIG. 2 is a perspective schematic view of the elastic member in the electronic device of FIG. 1. FIG. 3A is a front view of the elastic member of FIG. 2. FIG. 3B is a top view of the elastic member of FIG. 2. FIG. 3C is a bottom view of the elastic member of FIG. 2. FIG. 3D is a left side view of the elastic member of FIG. 2. FIG. 3E is a right side view of the elastic member of FIG. 2. FIG. 4 is a perspective schematic view of the inner portion the electronic device of FIG. 1. FIG. 5 is a cross-sectional schematic view along the section line A-A of FIG. 4.

Referring to FIG. 1, in this embodiment, an electronic device 100 is, for example, a display device, such as a television or a public information display (PID), but not limited thereto. In order to meet the current appearance requirements for the electronic device 100 (such as narrow frame), the electronic device 100 may use a backboard 120 as an appearance to dispose the display panel 110 on the backboard 120. An electronic element coupled to the front of the display panel 110 may be covered and/or protected by the front frame 150.

In detail, referring to FIG. 1, FIG. 4, and FIG. 5, the electronic device 100 of this embodiment includes a display panel 110, a backboard 120, and an elastic member 130. The backboard 120 includes a bottom portion 122, a side portion 124, and a carrier portion 126. The carrier portion 126 carries the display panel 110, and an accommodating space E for accommodating a backlight module (not shown) is provided between the carrier portion 126 and the bottom portion 122, which provides the light source required by the display panel 110. A gap G is provided between the display panel 110 and the side portion 124 when the display panel 110 is disposed in the carrier portion 126. The gap G is an assembly gap. Since the display panel 110 is disposed on the carrier portion 126 on the backboard 120, there are no other internal components (such as plastic components). When the light emitted by the backlight module leaks from the gap G, a so-called light leakage phenomenon occurs. In this case, the material of the backboard 120 is, for example, metal, and the carrier portion 126 is formed by bending the metal. The side portion 124 may be used as an appearance. The thickness T2 of the side portion 124 of the backboard 120 is twice the thickness T1 of the bottom portion 122.

In particular, the elastic member 130 of the embodiment includes a main body portion 132 and a protruding portion 134. The light leakage from the gap G is reduced by disposing the main body portion 132 in the accommodating space E between the carrier portion 126 and the bottom portion 122 of the backboard 120. More particularly, referring to FIG. 2, FIG. 3A, FIG. 3B, FIG. 3C, FIG. 3D, and FIG. 3E, in this embodiment, the elastic member 130 includes a main body portion 132 and a protruding portion 134 disposed on the main body portion 132. Furthermore, the elastic member 130 may further include a limiting portion 136 disposed on the main body portion 132 and opposite to the protruding portion 134. In this case, the main body portion 132, the protruding portion 134, and the limiting portion 136 are embodied as an integrally formed structure, for example, the elastic member 130 may be formed by injection molding, but not limited thereto. The limiting portion 136 includes a first portion 136a and a second portion 136b. The first portion 136a and the protruding portion 134 are opposite to each other. The second portion 136b may connect the first portion 136a and the protruding portion 134. The first portion 136a and the second portion 136b are, for example, L-shaped, but not limited thereto. Preferably, the protruding portion 134 has a first height H1, the limiting portion 136 has a second height H2, and the first height H1 is greater than the second height H2. In addition, the main body portion 132 of the elastic member 130 has at least one hole (three holes 135 are schematically shown). The hole 135 is located between the protruding portion 134 and the limiting portion 136, thereby increasing the space for the elastic member 130 to be compressed. That is, the space that allows deformation is increased. In this case, the elastic member 130 is made of elastic material, such as silica gel, but not limited thereto. In other words, the elastic member 130 of this embodiment may provide a buffering function and/or be easily disposed between the carrier portion 126 and the bottom portion 122, but not limited thereto.

Referring to FIG. 2, FIG. 4, and FIG. 5 again, the main body portion 132 of the elastic member 130 is located in the accommodating space E between the bottom portion 122 and the carrier portion 126 of the backboard 120, which may reduce the light leakage from the gap G. The protruding portion 134 of the elastic member 130 is located between the side portion 124 of the backboard 120 and the display panel 110, breakage of the display panel 110 by directly hitting the side portion 124 of the backboard 120 is then avoided. Preferably, the protruding portion 134 of the elastic member 130 has a first top surface S1, and the display panel 110 has a second top surface S2. Relative to the bottom portion 122, the highest point of the first top surface S1 may be flush with or slightly higher than the highest point of the second top surface S2. In addition, the electronic device 100 of this embodiment further includes a rubber strip 140 disposed on the bottom portion 122 of the backboard 120. The rubber strip 140 may be in direct contact with the main body portion 132 of the elastic member 130 and the first portion 136a of the limiting portion 136 to limit the position of the rubber strip 140.

It should be noted that, in this embodiment, the first portion 136a of the limiting portion 136 abuts the rubber strip 140 to limit the position of the rubber strip 140. The structural strength of the first portion 136a of the limiting portion 136 is enhanced by the second portion 136b of the limiting portion 136. However, in other embodiments not shown, if the elastic member has a certain hardness (strength), the second portion is not required. That is, the structural design of the limiting portion 136 may be adjusted according to the selected structure and/or material of the elastic member 130.

In terms of assembly, referring to FIG. 4 and FIG. 5 again, first, elements such as the light emitting element and the optical film are disposed in the accommodating space E. Moreover, the elastic member 130 is inserted into the accommodating space E between the carrier portion 126 and the bottom portion 122 of the backboard 120, thereby reducing the light leakage from the gap G. Optionally, gluing may be used for positioning. Next, the rubber strip 140 is disposed in the bottom portion 122 of the backboard 120. At this time, the elastic member 130 is compressed and squeezed from a first position P1 by the rubber strip 140 to a second position P2. The position of the rubber strip 140 is limited by the main body portion 132 and the first portion 136a of the limiting portion 136. The elastic member 130 may be provided with holes 135, the space for the elastic member 130 to be compressed may be increased by the size and/or the number of the holes 135. Lastly, the display panel 110 is disposed on the carrier portion 126 of the backboard 120. The protruding portion 134 of the elastic member 130 is disposed between one side of the display panel 110 and the side portion 124, breakage of the display panel 110 by directly hitting the backboard 120 is then avoided. The assembly of the electronic device 100 is now complete.

In short, the elastic member 130 of this embodiment may not only reduce the light leakage from the gap G by filling the gap G, but also provide cushioning function, so breakage of the display panel 110 by directly hitting the backboard 120 is then avoided. Compared with the prior art, this embodiment requires one elastic member 130 and one assembly step for reducing the light leakage from the gap G and reducing the breakage of the display panel 110 by directly hitting the backboard 120, which may reduce the cost effectively or enhance the structural reliability of the electronic device 100 in this embodiment.

To sum up, in the embodiment of the disclosure, the elastic member is disposed in the gap between the carrier portion and the bottom portion of the backboard. The main body portion is located between the bottom portion and the carrier portion of the backboard. The protruding portion is located between the side portion of the backboard and the display panel. Therefore, light leakage from the assembly gap is reduced. Breakage of the display panel by directly hitting the side portion of the backboard is avoided. That is, the issues of light leakage and the breakage of the display panel are handled simultaneously, which may enhance the structural reliability of the electronic device of the disclosure or reduce the cost effectively.

Furthermore, it should be noted that the above embodiments are only used to illustrate the technical solutions of the disclosure and are not intended to limit it. Although the disclosure has been described in detail with reference to the above embodiments, persons of ordinary skill in the art should understand that they may still modify the technical solutions described in the above embodiments, or replace some or all of the technical features therein with equivalents, and that modifications or replacements of corresponding technical solutions do not substantially deviate from the scope of the technical solutions of the embodiments of the disclosure.

What is claimed is:
1. An electronic device, comprising:
a display panel;
a backboard, comprising a bottom portion, a side portion, and a carrier portion, wherein the display panel is disposed on the carrier portion, and an accommodating space is provided between the carrier portion and the bottom portion; and
an elastic member, comprising a main body portion and a protruding portion disposed on the main body portion, wherein the main body portion is located in the accommodating space between the bottom portion and the carrier portion of the backboard, and the protruding portion is located between the side portion of the backboard and the display panel;

wherein the elastic member further comprises a limiting portion disposed on the main body portion and opposite to the protruding portion, the main body portion of the elastic member has at least one hole, and the at least one hole is located between the protruding portion and the limiting portion.

2. The electronic device according to claim 1, wherein the protruding portion has a first height, the limiting portion has a second height, and the first height is greater than the second height.

3. The electronic device according to claim 1, wherein the main body portion, the protruding portion, and the limiting portion are embodied as an integrally formed structure.

4. The electronic device according to claim 1, wherein the limiting portion comprises a first portion and a second portion, the first portion is opposite to the protruding portion, and the second portion connects the first portion and the protruding portion.

5. The electronic device according to claim 4, wherein the first portion and the second portion are L-shaped.

6. The electronic device according to claim 4, further comprising:
a rubber strip, disposed on the bottom portion of the backboard, wherein the rubber strip is in direct contact with the main body portion of the elastic member and the first portion of the limiting portion.

7. The electronic device according to claim 6, wherein the first portion of the limiting portion abuts the rubber strip to limit a position of the rubber strip, and a structural strength of the first portion of the limiting portion is enhanced by the second portion of the limiting portion.

8. The electronic device according to claim 1, wherein a structural design of the limiting portion is adjusted according to at least one of a selected structure and a material of the elastic member.

9. The electronic device according to claim 1, wherein a space for the elastic member to be compressed is increased by a size and/or a number of the at least one hole.

10. The electronic device according to claim 1, wherein the protruding portion of the elastic member has a first top surface, the display panel has a second top surface, and a highest point of the first top surface is greater than or equal to a highest point of the second top surface.

11. The electronic device according to claim 1, wherein a thickness of the side portion of the backboard is twice a thickness of the bottom portion.

12. The electronic device according to claim 1, wherein a material of the backboard comprises metal, and the carrier portion is formed by bending the metal.

13. The electronic device according to claim 1, wherein a material of the elastic member comprises silica gel.

14. The electronic device according to claim 1, wherein the side portion of the backboard is used as an appearance.

15. The electronic device according to claim 1, wherein an assembly gap is provided between the display panel and the side portion of the backboard.

16. The electronic device according to claim 1, wherein the elastic member is positioned in the accommodating space between the carrier portion and the bottom portion of the backboard by gluing.

17. The electronic device according to claim 1, wherein the display panel is disposed on the backboard, and an electronic element coupled to a front of the display panel is covered and/or protected by a front frame.

18. The electronic device according to claim 1, wherein the electronic device comprises a television or a public information display.

19. An electronic device, comprising:
a display panel;
a backboard, comprising a bottom portion, a side portion, and a carrier portion, wherein the display panel is disposed on the carrier portion, and an accommodating space is provided between the carrier portion and the bottom portion;
an elastic member, comprising a main body portion, a protruding portion disposed on the main body portion and a limiting portion disposed on the main body portion and opposite to the protruding portion, wherein the main body portion is located in the accommodating space between the bottom portion and the carrier portion of the backboard, and the protruding portion is located between the side portion of the backboard and the display panel, and the limiting portion comprises a first portion and a second portion, the first portion is opposite to the protruding portion, and the second portion connects the first portion and the protruding portion; and
a rubber strip, disposed on the bottom portion of the backboard, wherein the rubber strip is in direct contact with the main body portion of the elastic member and the first portion of the limiting portion.

* * * * *